United States Patent
Lai et al.

(10) Patent No.: US 11,756,876 B2
(45) Date of Patent: Sep. 12, 2023

(54) SEMICONDUCTOR DEVICES HAVING POWER RAILS AND SIGNAL TRACKS ARRANGED IN DIFFERENT LAYER

(71) Applicant: TAIWAN SEMICONDUCTOR MANUFACTURING COMPANY LTD., Hsinchu (TW)

(72) Inventors: Wei-An Lai, Taichung (TW); Wei-Cheng Lin, Taichung (TW); Jiann-Tyng Tzeng, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 410 days.

(21) Appl. No.: 16/837,918

(22) Filed: Apr. 1, 2020

(65) Prior Publication Data

US 2021/0313263 A1    Oct. 7, 2021

(51) Int. Cl.
*H01L 23/522* (2006.01)
*H01L 23/48* (2006.01)
*H01L 23/528* (2006.01)
*H01L 23/535* (2006.01)
*H01L 27/118* (2006.01)

(52) U.S. Cl.
CPC ........ *H01L 23/5226* (2013.01); *H01L 23/481* (2013.01); *H01L 23/528* (2013.01); *H01L 23/5286* (2013.01); *H01L 23/535* (2013.01); *H01L 2027/11888* (2013.01)

(58) Field of Classification Search
CPC ....... H01L 2027/11881; H01L 23/5286; H01L 23/5226; H01L 23/481; H01L 23/535; H01L 2027/11883–11888; H01L 2924/1517; H01L 2224/02331; H01L 23/49527; H01L 23/528; H05K 2201/09754; H05K 2201/09681
See application file for complete search history.

(56) References Cited

U.S. PATENT DOCUMENTS

| | | | |
|---|---|---|---|
| 6,583,045 B1* | 6/2003 | Liu ...................... | H01L 23/535 257/276 |
| 7,240,314 B1* | 7/2007 | Leung ................. | H01L 23/5286 716/120 |
| 10,020,261 B2* | 7/2018 | Wu ....................... | H01L 23/528 |
| 10,510,774 B2* | 12/2019 | Debacker ............ | H01L 27/0207 |
| 11,071,197 B2* | 7/2021 | Choi ..................... | H01L 23/66 |
| 2021/0118798 A1* | 4/2021 | Liebmann ......... | H01L 21/76895 |

* cited by examiner

*Primary Examiner* — Mary A Wilczewski
*Assistant Examiner* — Diana C Vieira
(74) *Attorney, Agent, or Firm* — WPAT LAW; Anthony King

(57) ABSTRACT

A semiconductor device includes a base, source, drain and gate electrodes, signal tracks and a power mesh. The source, drain and gate electrodes are arranged on a surface of the base, wherein the gate electrodes are extended along a first direction. The signal tracks arranged above the first surface of the base and above the source and drain electrodes and the gate electrodes, wherein the signal tracks are extended along the first directions. A power mesh is arranged below the first surface of the base, the power mesh comprising first power rails extended in the second direction and second power rails extended in a first direction, wherein the second direction is substantially perpendicular to the first direction.

20 Claims, 6 Drawing Sheets

SEMICONDUCTOR DEVICES HAVING POWER RAILS AND SIGNAL TRACKS ARRANGED IN DIFFERENT LAYER

BACKGROUND

In advanced semiconductor technologies, continued reduction in device size and increasingly complex circuit arrangements have made the design and fabrication of integrated circuits (ICs) more challenging and costly.

In a standard cell structure, a first metal layer formed on a substrate includes power rails and route tracks. The power rails and route tracks are arranged in the same layer.

As cell size decreases, the line width and line pitch of the power rails and route tracks have to be reduced. This causes a significant IR drop and performance degradation due to high resistance, which degrades cell performance.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
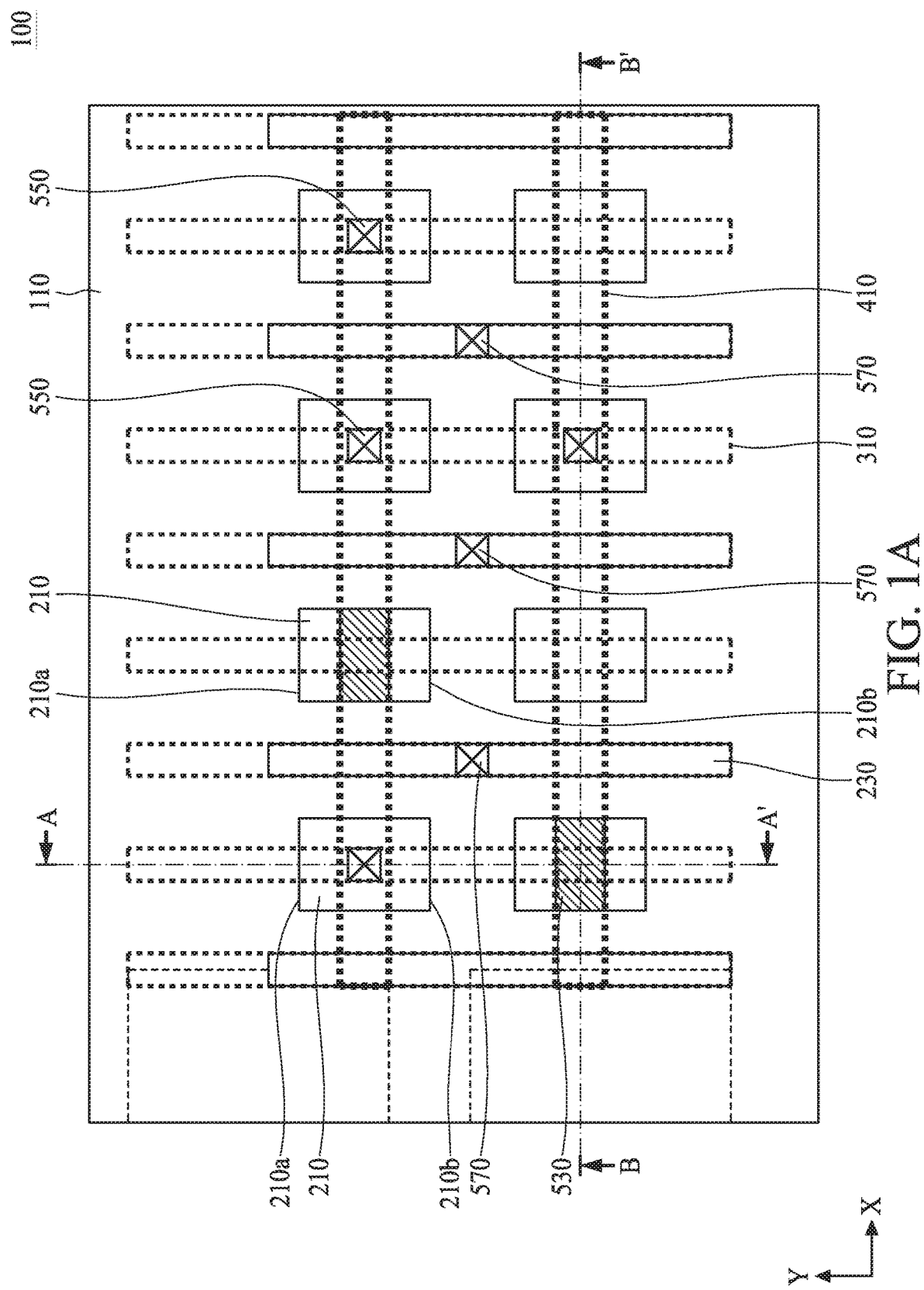
FIG. 1A is a perspective view of a semiconductor device, in accordance with some embodiments of the present disclosure.

In the following detailed description, numerous specific details are set forth in order to provide a thorough understanding of the present disclosure. However, it should be understood by those skilled in the art that the present disclosure may be practiced without these specific details. In other instances, well-known methods, procedures, components and circuits are not described in detail so as not to obscure the present disclosure.

Further, the present disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about." "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

It should be understood that in the present disclosure, one pattern/layer/structure/surface/direction/track/rail being substantially perpendicular to another pattern/layer/structure/surface/direction/track/rail means that the two patterns/layers/structures/surfaces/directions/tracks/rails are perpendicular to each other, or the two patterns/layers/structures/surfaces/directions/tracks/rails are intended to be configured to be perpendicular to each other but may not be perfectly perpendicular to each other due to design, manufacturing, measurement errors/margins caused by unperfected manufacturing and measurement conditions. Such a description should be recognizable to one of ordinary skill in the art.

It should be understood that in the present disclosure, one pattern/layer/structure/surface/direction/track/rail being substantially parallel to another pattern/layer/structure/surface/direction/track/rail means that the two patterns/layers/structures/surfaces/directions/tracks/rails are parallel to each other, or the two patterns/layers/structures/surfaces/directions/tracks/rails are intended to be configured to be parallel to each other but may not be perfectly parallel to each other due to design, manufacturing, measurement errors/margins caused by unperfected manufacturing and measurement conditions. Such a description should be recognizable to one of ordinary skill in the art.

In the present disclosure, layers/patterns/structures/tracks/rails being formed of substantially the same material means that the layers/patterns/structures/tracks/rails are formed of the same material or the layers/patterns/structures/tracks/rails are originally formed of the same material but can have impurities having the same or different types with the same or different concentrations doped later in order to implement a semiconductor device. Such a description should be recognizable to one of ordinary skill in the art.

In the present disclosure, two layers/patterns/structures/tracks/rails being formed on a same level means that the two layers/patterns/structures/tracks/rails have a same distance from a reference plane, for example, a surface of a substrate, based on which a semiconductor device is formed, or the two layers/patterns/structures/tracks/rails are intended to be configured to have a same distance from a reference plane, for example, a surface of a substrate, based on which a semiconductor device is formed but may not perfectly have the same distance from the reference plane due to design, manufacturing, measurement errors/margins caused by unperfected manufacturing and measurement conditions. Such a description should be recognizable to one of ordinary skill in the art.

In the present disclosure, "about" or "approximately" used to describe a value of a parameter means that the parameter is equal to the described value or that the parameter is within a certain range of the described value, when design error/margin, manufacturing error/margin, measurement error etc. are considered. Such a description should be recognizable to one of ordinary skill in the art.

In the new structure, the power rails and route tracks are arranged in different layer without increasing size. The arrangement at least can release line width and line pitch. Accordingly, the resistance problem will be limited in an effective way.

FIG. 1A is a perspective view of a semiconductor device 100 in accordance with some embodiments of the present disclosure.

The semiconductor device 100 includes a base 110, source/drain electrodes 210 and gate electrodes 230, signal tracks 310 and a power mesh 410.

The semiconductor device 100 includes one or more metal-oxide semiconductor field-effect transistors (MOSFET). In some embodiments, the transistors are fin-type FET (FinFET), planar MOSFET, nano-sheet, stacked nano-wire, or other types of transistors. In some embodiments, FinFET devices are used to implement the memory array due to their performance advantages.

The base 110 may be a single carrier or substrate. The base 110 may be a bulk silicon substrate. Alternatively, the base 110 may comprise another elementary semiconductor, such as germanium, or a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In one embodiment, the base 110 is a silicon on insulator (SOI). In another embodiment, the base 110 may be an epitaxial material.

Figure 1B:
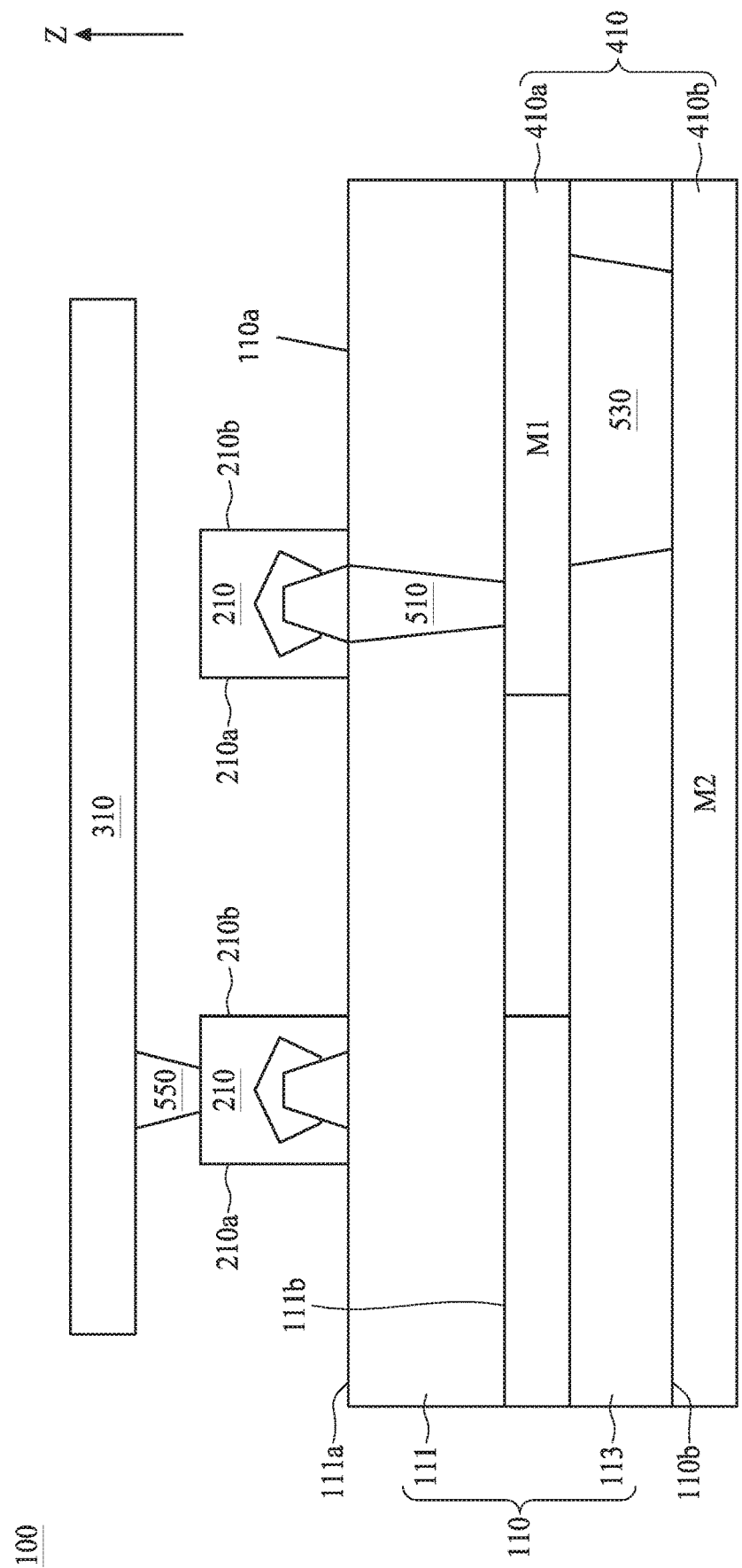
FIG. 1B is a cross-section view of a semiconductor device of FIG. 1A, in accordance with some embodiments of the present disclosure.

In some embodiments, the base 110 includes more than one carrier or substrate. Referring to FIG. 1B, the base 110 includes a substrate 111 and a substrate 113. The substrates 111, 113 may be bulk silicon substrates. Alternatively, the substrates 111, 113 may comprise another elementary semiconductor, such as germanium, or a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In one embodiment, at least one of the substrates 111, 113 is a silicon on insulator (SOI). In another embodiment, the material of substrates 111, 113 may be epitaxial material.

Figure 1C:
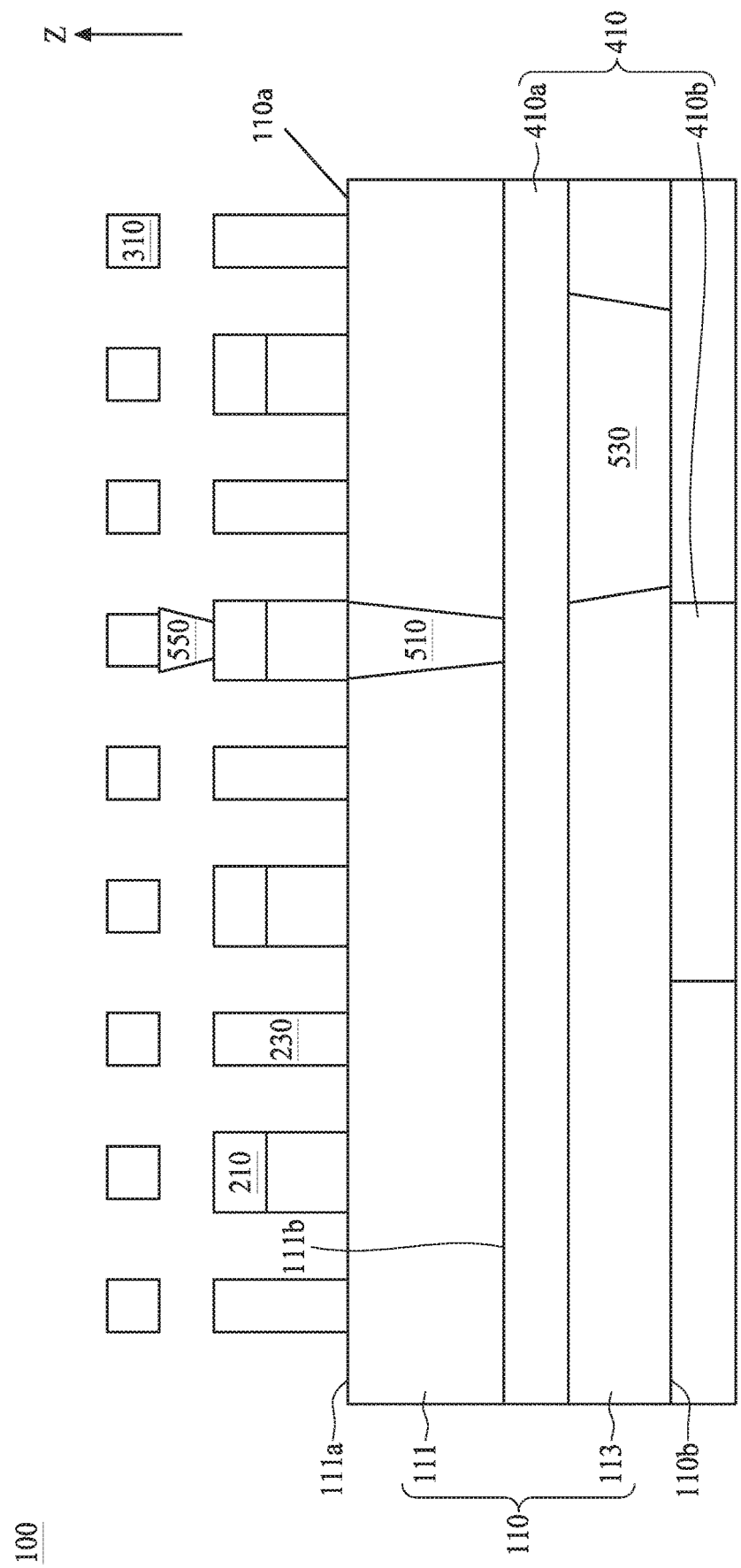
FIG. 1C is a cross-section view of a semiconductor device of FIG. 1A, in accordance with some embodiments of the present disclosure.

FIG. 1B is a cross-sectional view of the semiconductor device 100 along line A-A' in FIG. 1A. FIG. 1C is a cross-sectional view of the semiconductor device 100 along line B-B' in FIG. 1A. The source/drain electrodes 210 are arranged on a surface 110a of the base 110 in the Z direction as shown in FIG. 1B. In some embodiments, the source/drain electrodes 210 are arranged in an array with rows and columns. The source/drain electrodes 210 arranged in the row are aligned with each other in the X direction, and the source/drain electrodes 210 arranged in the same column are aligned with each other in the Y direction.

Referring to FIG. 1A, each of the source/drain electrodes 210 has an edge 210a and an edge 210b positioned in the Y direction of the pattern of the source/drain electrode, wherein the edge 210a is opposite the edge 210b. Each of the edges of 210a and 210b of the source/drain electrodes 210 arranged in the same row are aligned with each other. Similarly, each of edges positioned in the X direction of the pattern of the respective source/drain electrodes are aligned with each other.

The gate electrodes 230 are arranged on the surface 110a of the base 110. The gate electrodes 230 are arranged between adjacent source/drain electrodes 210 in the X direction. The gate electrodes 230 may elongate along the Y direction. In some embodiments, one gate electrode 230 is arranged between more than one pair of source/drain electrodes 210. In other words, more than one pair of source/drain electrodes 210 share one gate electrode 230.

The gate electrodes 230 include Ti, Ag, TaAl, TaAlC, TiAlN, TaC, TaCN, TaSiN, Mn, Zr, TiN, TaN, Ru, Mo, Al, WN, ZrSi2, MoSi2, TaSi2, NiSi2, WN, other suitable work function materials, or combinations thereof. The gate electrodes 230 may be deposited by chemical vapor deposition (CVD), plasma-enhanced CVD (PECVD), physical vapor deposition (PVD), atomic layer deposition (ALD), plasma-enhanced ALD (PEALD) and/or other suitable deposition process. The gate electrodes 230 may include Al, or W, and/or other suitable materials.

The semiconductor device 100 has a gate insulating layer formed of, for example, a high-k dielectric material such as a metal oxide including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate insulating layer is interposed between the gate electrodes 230 and the base 110.

The signal tracks 310 electrically connect to the source/drain electrodes 210 through vias 550. The signal tracks are arranged above the first surface 110a of the base 100. The signal tracks are arranged above the source/drain electrodes 210. The signal tracks 310 extend along the Y direction. The signal tracks are arranged substantially in parallel.

The signal tracks 310 extend over the source/drain electrodes 210. In some embodiments, some signal tracks 310 are aligned with the source/drain electrodes 210 in the Z direction. The signal tracks 310 couple to the source/drain electrodes 210 through the vias 550 along the Z direction substantially perpendicular to the surface 110a of the base 110. In some embodiments, the source/drain electrodes 210 are parallel to gate electrodes 230. The signal tracks 310 may couple to and electrically connect to the gate electrodes 230 through vias 570.

The signal tracks 310 and vias 550 are electrically insulated by dielectric materials, usually referred to as inter-metal dielectrics (IMD). In some embodiments, the signal tracks 310 and vias 550 may be formed of conductive materials, such as titanium, titanium nitride, tantalum, tantalum nitride, copper, silver, aluminum, gold, tungsten, combinations thereof, or the like. For example, in some embodiments, titanium is used as an adhesive layer and titanium nitride is used as a filling layer over the titanium layer. In some embodiments, the IMD comprises silicon oxide, silicon nitride, silicon oxynitride, silicon carbide, un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), or the like.

Although FIG. 1B shows only one layer of signal tracks, the semiconductor device 100 may include more than one layer of signal tracks. The semiconductor device 100 may include 5 to 20 layers of signal tracks.

The power mesh 410 is arranged below the surface 110a of the base 110. The power mesh 410 includes power rails 410a and 410b substantially perpendicular to each other. The power rails 410a and 410b may be electrically connected to each other through vias 530 in the Z direction. The Z direction corresponds to the depth direction of the base 110.

In some embodiments, the power rails 410a in the M1 layer extend in the X direction perpendicular to the signal tracks 310, and the power rails 410b in the M2 layer extend in the Y direction parallel to the signal tracks 310. The power rails 410a in the M1 layer is the first metal layer below the surface 110a of the base 110, and the power rails 410b in the M2 layer is the second layer below the surface 110a of the base 110. The power rails 410a are arranged closer to the surface 110a of the base 110 than the power rails 410b.

In some embodiments, the power rails 410a in the M1 layer extend in the Y direction substantially parallel to the signal tracks 310, and the power rails 410b in the M2 layer extend in the X direction substantially perpendicular to the signal tracks 310.

In some embodiments, the vias 510 is formed through the substrate 111 having a surface 111a and 111b. The surface 111a of the substrate 111 corresponds to the surface 110a of the base 110. The power rails 410a are formed on the surface 111b opposite the surface 111a. A further substrate 113 is stacked over the M1 layer. The M2 layer is formed on a surface of the substrate 113, i.e., a surface 110b opposite the surface 110a of the base 110.

In some embodiments, the power rails 410a, 410b are electrically insulated by dielectric materials, usually referred to as inter-metal dielectrics (IMD). In some embodiments, the power rails 410a, 410b may be formed of conductive materials, such as Cobalt, copper, Ruthenium, titanium, titanium nitride, tantalum, tantalum nitride, silver, aluminum, gold, tungsten, combinations thereof, or the like. For example, in some embodiments, titanium is used as an adhesive layer and titanium nitride is used as a filling layer over the titanium layer. In some embodiments, the IMD comprises silicon oxide, silicon nitride, silicon oxynitride, silicon carbide, un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), or the like.

The power mesh 410 is not arranged at the same layer of the signal tracks 310. The power mesh 410 and the signal tracks 310 are arranged at different height levels. Therefore, the dimension of the signal tracks 310 and the power rails 410a, 410b can be widened. The resistance of the signal tracks 310 and the power rails 410a, 410b can be reduced accordingly. The IR drop of semiconductor device 100 can be effectively reduced, and the device performance can be improved.

Further, since the dimension of the signal tracks 310 and the power rails 410a, 410b can be widened, the contact areas between the vias and the signal tracks, and those between the vias and the power rails can be increased. Accordingly, the contact resistance can be effectively reduced.

The vias 510, 530, 550, 570 are electrically insulated by dielectric materials, usually referred to as inter-metal dielectrics (IMD). In some embodiments, the vias 510, 530, 550, 570 may be formed of conductive materials, such as Cobalt, copper, Ruthenium, titanium, titanium nitride, tantalum, tantalum nitride, silver, aluminum, gold, tungsten, combinations thereof, or the like. For example, in some embodiments, titanium is used as an adhesive layer and titanium nitride is used as a filling layer over the titanium layer. In some embodiments, the IMD comprises silicon oxide, silicon nitride, silicon oxynitride, silicon carbide, un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), or the like.

Further referring to FIG. 1A, two adjacent pairs of source/drain electrodes share a gate electrode. The vias 550 between a layer of the source/drain electrodes 210 and the layer of signal tracks 310 are arranged along the signal tracks 310, and form rows along the X direction. In the present disclosure, the vias 570 for coupling the gate electrodes 210 to the signal tracks 310 are aligned with each other in the X direction. The vias 530 for coupling power rails 410a to power rails 410b are arranged to align with crossings of the power rails 410a, 410b and the signal tracks 310 in the Z direction. In this way, the vias 530, 550, 570 can be arranged in the crossings of the metal layers in different layers, such as gate electrodes 230, source/drain electrodes 210, signal tracks 310, and power rails 410a, 410b, so that alignment between different layers can be simplified, and misalignment can be reduced. Accordingly, the manufacturing yield of devices can be effectively enhanced.

The power rails 410a in the M1 layer and vias 510 and 530 are embedded in the base 110. In some embodiments, the power rails 410a and vias 530 for coupling power rails 410a to power rails 410b, and vias 510 for coupling power rails 410a to source/drain electrodes 210 may be embedded in a single carrier or substrate. The power rails 410b are formed on a surface 110b of the base in the form of a single substrate, the surface 110b opposite the surface 110a. Such embodiment can effectively reduce a total thickness of the semiconductor device.

Figure 2:
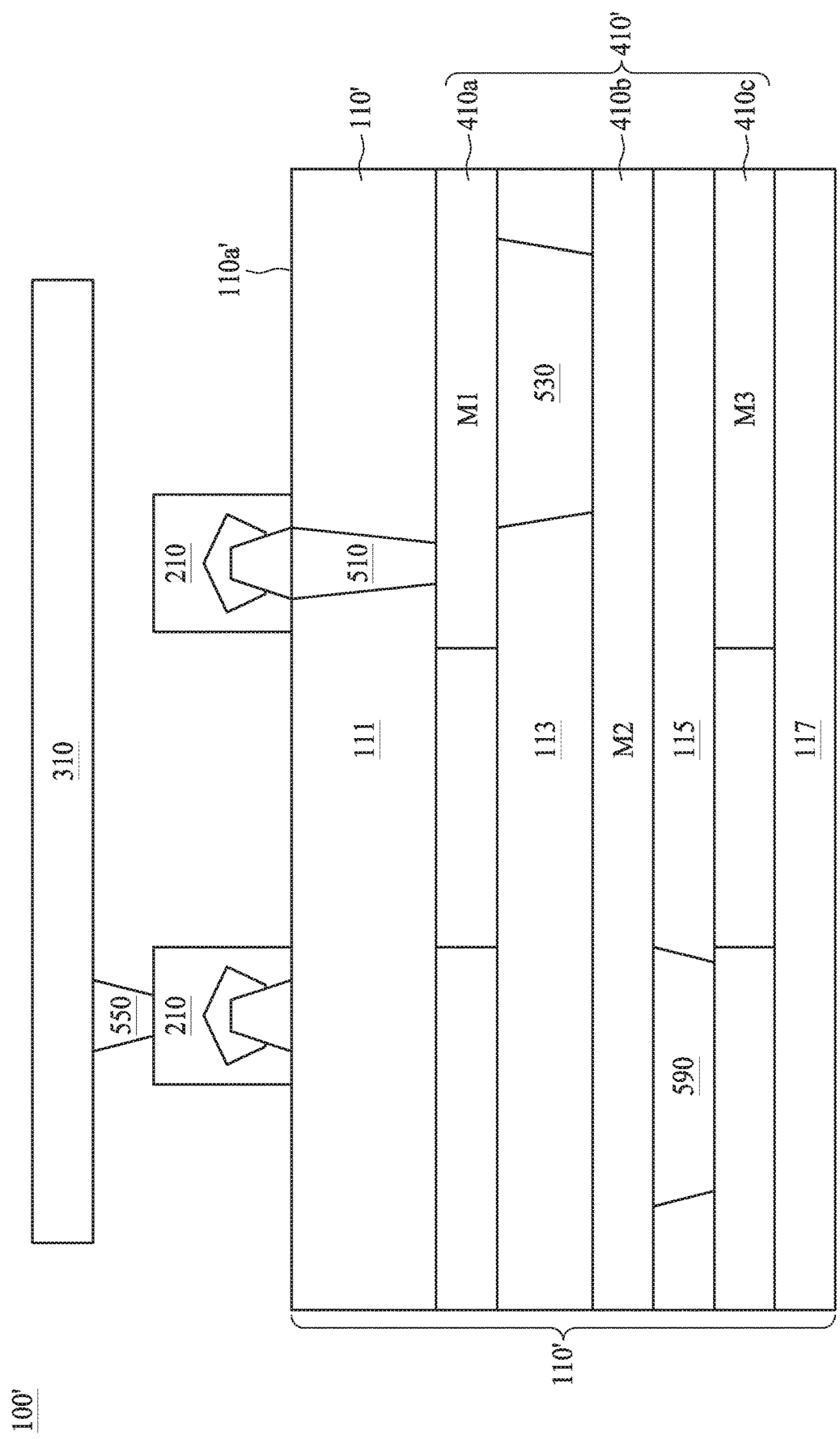
FIG. 2 is a cross-section view of a semiconductor device, in accordance with some embodiments of the present disclosure.

FIG. 2 is a cross-section view a semiconductor device 100' in some embodiments of the present disclosure. The semiconductor device 100' includes a base 110', source/drain electrodes 210 and gate electrodes 230, signal tracks 310 and a power mesh 410'.

The semiconductor device 100' includes a metal-oxide semiconductor (MOS) field-effect transistor (MOSFET). In some embodiments, the transistors are fin-type FET (FinFET), planar MOSFET, Nano-sheet, stacked nano-wire, or other types of transistors. In some embodiments, FinFET devices are used to implement the memory array due to their performance advantages.

The base 110' may be a single carrier or substrate. The base 110' may be a bulk silicon substrate. Alternatively, the base 110' may comprise another elementary semiconductor, such as germanium, or a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In one embodiment, the base 110' is a silicon on insulator (SOI). In another embodiment, the base 110' may be an epitaxial material.

In some embodiments, the base 110' includes more than one carrier or substrate. The base 110' including a substrate 111, a substrate 113, a substrate 115 and a substrate 117. At least one of the substrates 111, 113, 115, 117 may be bulk silicon substrates. Alternatively. At least one of the substrates 111, 113, 115, 117 may comprise another elementary semiconductor, such as germanium, or a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In one embodiment, At least one of the substrates 111, 113, 115, 117 is a silicon on insulator (SOI). In another embodiment, the material of substrates 111, 113 may be epitaxial material.

In the semiconductor device 100', the source/drain electrodes 210 are arranged on a surface 110a' of the base 110' in the Z direction. In some embodiments, the source/drain electrodes 210 are arranged in an array with rows and column. The source/drain electrodes 210 arranged in a row are aligned with each other in the X direction, and the source/drain electrodes 210 arranged in a column are aligned with each other in the Y direction.

In some embodiments, each of the source/drain electrodes 210 has an edge 210a and an edge 210b positioned in the Y direction of the pattern of the source/drain electrode, wherein the edge 210a is opposite edge 210b. Each of the edges of 210a and 210b of the source/drain electrodes 210 arranged in the same row are aligned with each other. Similarly, each of edges positioned in the X direction of the pattern of respective source/drain electrode are aligned with each other.

The gate electrodes 230 are arranged on the surface 110a' of the base 110'. The gate electrodes 230 are arranged between adjacent source/drain electrodes 210 in the X direction. The gate electrodes 230 may elongate along the Y direction. In some embodiments, one gate electrode 230 is arranged between more than one pair of source/drain electrodes 210. In other words, more than one pair of source/drain electrodes 210 share one gate electrode 230.

In the semiconductor device 100', the gate electrodes 230 include Ti, Ag, TaAl, TaAlC, TiAlN, TaC, TaCN, TaSiN, Mn, Zr, TiN, TaN, Ru, Mo, Al, WN, ZrSi2, MoSi2, TaSi2, NiSi2, WN, other suitable work function materials, or combinations thereof. The gate electrodes 230 may be deposited by chemical vapor deposition (CVD), plasma-enhanced CVD (PECVD), physical vapor deposition (PVD), atomic layer deposition (ALD), plasma-enhanced ALD (PEALD) and/or other suitable deposition process. The gate electrodes 230 may include Al, or W, and/or other suitable materials.

The semiconductor device 100' has a gate insulating layer formed of, for example, a high-k dielectric material such as a metal oxide including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate insulating layer is interposed between the gate electrode 230 and the base 110'.

The signal tracks 310 electrically connect to the source/drain electrodes 210 through vias 550. The signal tracks are arranged above the first surface 110a' of the base 100'. The signal tracks are arranged above the source/drain electrodes 210. The signal tracks 310 extend along the Y direction. The signal tracks are arranged substantially in parallel.

The signal tracks 310 extend over the source/drain electrodes 210. In some embodiments, some signal tracks 310 align to the source/drain electrodes in the Z direction. The signal tracks 310 couple to the source/drain electrodes 210 through the vias 550 along the Z direction substantially perpendicular to the surface 110a' of the base 110'. In some embodiments, the source/drain electrodes 210 are parallel to gate electrodes 230. The signal tracks 310 may couple to and electrically connect to the gate electrodes 230 through vias 570.

The signal tracks 310 and vias 550 are electrically insulated by dielectric materials, usually referred to as inter-metal dielectrics (IMD). In some embodiments, the signal tracks 310 and vias 550 may be formed of conductive materials, such as titanium, titanium nitride, tantalum, tantalum nitride, copper, silver, aluminum, gold, tungsten, combinations thereof, or the like. For example, in some embodiments, titanium is used as an adhesive layer and titanium nitride is used as a filling layer over the titanium layer. In some embodiments, the IMD comprises silicon oxide, silicon nitride, silicon oxynitride, silicon carbide, un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), or the like.

Although FIG. 2 show only one layer of signal tracks, the semiconductor device 100' may include more than one layer of signal tracks. The semiconductor device 100' may include 5 to 20 layers of signal tracks. The signal tracks in different layer may be perpendicular to each other or may be parallel to each other.

The power mesh 410' is arranged below the surface 110a' of the base 110'. The power mesh 410' includes more than two layers of power rails. The power mesh 410' includes power rails 410a, 410b, 410c substantially perpendicular to each other. The power rails 410a and power rails 410b may be electrically connect to each other through vias 530 in the Z direction. The power rails 410b and power rails 410c may be electrically connect to each other through vias 590 in the Z direction. The Z direction corresponds to the depth direction of the base 110'.

In some embodiments, the power rails 410a in the M1 layer extend in the X direction perpendicular to the signal tracks 310, the power rails 410b in the M2 layer extend in the Y direction parallel to the signal tracks 310, and the power rails 410c in the M3 layer extend in the X direction perpendicular to the signal tracks 310. The power rails 410a in the M1 layer is the first metal layer below the surface 110a' of the base 110', the power rails 410b in the M2 layer is the second layer below the surface 110a' of the base 110', and the power rails 410c in the M3 layer is the third layer below the surface 110a' of the base 110'.

In some embodiment, the power rails 410a in the M1 layer extend in the Y direction parallel to the signal tracks 310, the power rails 410b in the M2 layer extend in the X direction perpendicular to the signal tracks 310, and the power rails 410c in the M3 layer extend in the Y direction parallel to the signal tracks 310.

The power mesh 410' is not arranged at the same layer of the signal tracks 310. The power mesh 410' and the signal tracks 310 are arranged at different height levels. Therefore, the dimension of the signal tracks 310 and the power rails 410a, 410b, 410c can be increased. In other words, the line width of the signal tracks 310 and that of the power rails 410a, 410b, 410c can be widened. The resistance of the signal tracks 310 and the power rails 410a, 410b, 410c can be reduced accordingly. The IR drop of semiconductor device 100' can be effectively reduced, and the device performance can be improved.

Further, since the dimension of the signal tracks 310 and the power rails 410a, 410b, 410c can be widened, the contact areas between the vias and the signal tracks, and those between the vias and the power rails can be increased. Accordingly, the contact resistance can be effectively reduced.

Although FIG. 2 show only three layers of power rails, a power mesh may include more than three layers of power rails. The power mesh may include 5 to 20 layers of power rails.

The power rails 410a, 410b, 410c and vias 510, 530, 550 are electrically insulated by dielectric materials, usually referred to as inter-metal dielectrics (IMD). In some embodiments, the power rails 410a, 410b, 410c and vias 510, 530, 550 may be formed of conductive materials, such as titanium, titanium nitride, tantalum, tantalum nitride, copper, silver, aluminum, gold, tungsten, combinations thereof, or the like. For example, in some embodiments, titanium is used as an adhesive layer and titanium nitride is used as a filling layer over the titanium layer. In some embodiments, the IMD comprises silicon oxide, silicon nitride, silicon oxynitride, silicon carbide, un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), or the like.

The power rails 410a in the M1 layer, the power rails 410b in the M2 layer, the power rails 410c in the M3 layer and vias 510 and 530 are embedded in the base 110'. In some embodiments, the power rails 410a, 410b, 410c and vias 510, 530, 550 may be embedded in a single carrier or substrate. Such embodiment can effectively reduce a total thickness of the semiconductor device.

Figure 3:
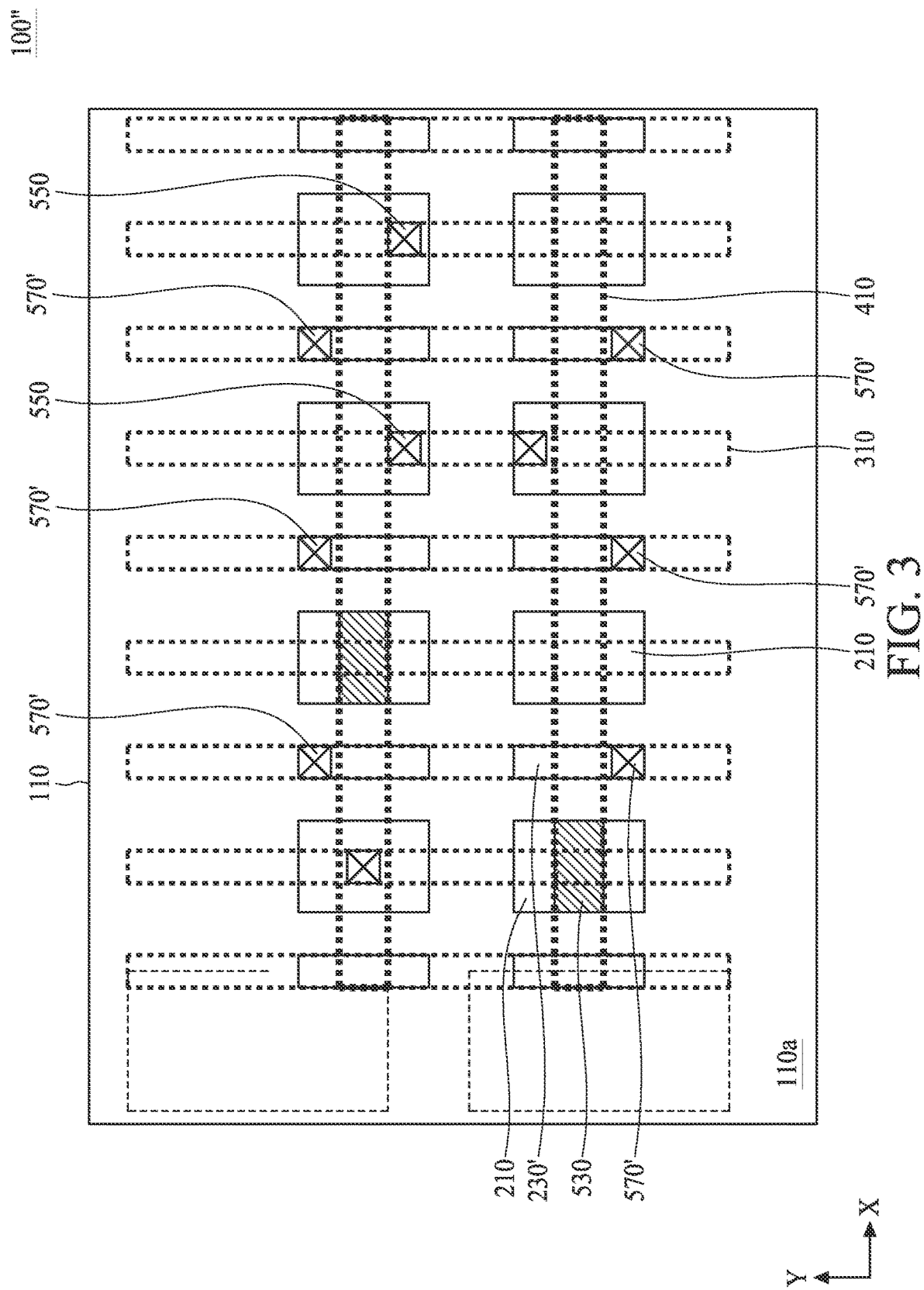
FIG. 3 is a perspective view of a semiconductor device, in accordance with some embodiments of the present disclosure.

FIG. 3 shows a perspective diagram of semiconductor device 100". The semiconductor device 100" includes a base 110, source/drain electrodes 210, gate electrodes 230', signal tracks 310 and a power mesh 410.

The semiconductor device 100" includes a metal-oxide semiconductor (MOS) field-effect transistor (MOSFET). In some embodiments, the transistors are fin-type FET (Fin-FET), planar MOSFET, nano-sheet, stacked nano-wire, or other types of transistors. In some embodiments, FinFET devices are used to implement the memory array due to their performance advantages.

The base 110 may be a single carrier or substrate. The base 110 may be a bulk silicon substrate. Alternatively, the base 110 may comprise another elementary semiconductor, such as germanium, or a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In one embodiment, the base 110 is a silicon on insulator (SOI). In another embodiment, the base 110 may be an epitaxial material.

In some embodiments, the base 110 includes more than one carrier or substrate. The substrates may be bulk silicon substrates. Alternatively, the substrates may comprise another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In one embodiment, at least one of the substrates is a silicon on insulator (SOI). In another embodiment, the material of substrates may be epitaxial material.

The source/drain electrodes 210 are arranged on a surface 110a of the base 110 substantially perpendicular to a surface 110a of the base 110. In some embodiments, the source/drain electrodes 210 are arranged in an array with rows and columns. The source/drain electrodes 210 arranged in the row are aligned with each other in the X direction, and the source/drain electrodes 210 arranged in the same column are aligned with each other in the Y direction.

Each of the source/drain electrodes 210 has an edge 210a and an edge 210b positioned in the Y direction of the pattern of the source/drain electrode, wherein the edge 210a is opposite edge 210b. Each of the edges of 210a and 210b of the source/drain electrodes 210 arranged in the same row are aligned with each other. Similarly, each edge positioned in the X direction of the pattern of respective source/drain electrode are aligned with each other.

The semiconductor device 100" refers to a dual gate contact structure. One pair of source/drain electrodes 210 shares one gate electrode 230'. The gate electrodes 230' are arranged on the surface 110a of the base 110. The gate electrodes 230' are arranged between adjacent source/drain electrodes 210 in the X direction. In some embodiment, the gate electrodes 230 may elongate along the Y direction.

Two adjacent gate electrodes 230' aligned in the Y direction couple to one signal track 310 overlaid the gate electrodes 230' through vias 570'. The vias 570' corresponding to adjacent signal tracks are arranged in rows along the X direction. The vias 530 electrically coupling power rails 410a, 410b are arranged to align to crossings of the power rails in the Z direction perpendicular to the surface 110a of the base 110. In other words, the vias 530 are arranged to align to crossings of the power rails in depth direction of the base 110.

The gate electrodes 230' include Ti, Ag, TaAl, TaAlC, TiAlN, TaC, TaCN, TaSiN, Mn, Zr, TiN, TaN, Ru, Mo, Al, WN, ZrSi2, MoSi2, TaSi2, NiSi2, WN, other suitable work function materials, or combinations thereof. The gate electrodes 230 may be deposited by chemical vapor deposition (CVD), plasma-enhanced CVD (PECVD), physical vapor deposition (PVD), atomic layer deposition (ALD), plasma-enhanced ALD (PEALD) and/or other suitable deposition process. The gate electrodes 230 may include Al, or W, and/or other suitable materials.

The semiconductor device 100" has a gate insulating layer formed of, for example, a high-k dielectric material such as a metal oxide including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate insulating layer is interposed between the gate electrode 230' and the base 110.

The signal tracks 310 electrically connect to the source/drain electrodes 210 through vias 550. The signal tracks are arranged above the first surface 110a of the base 100". The signal tracks are arranged above the source/drain electrodes 210. The signal tracks 310 extend along the Y direction. The signal tracks are arranged substantially in parallel.

The signal tracks 310 extend over the source/drain electrodes 210. In some embodiments, some signal tracks 310 align to the source/drain electrodes in the Z direction. The signal tracks 310 couple to the source/drain electrodes 210 through the vias 550 along the Z direction substantially perpendicular to the surface 110a of the base 110. In some embodiments, the source/drain electrodes 210 are parallel to gate electrodes 230'. The signal tracks 310 may couple to and electrically connect to the gate electrodes 230' through vias 570'.

The signal tracks 310 and vias 550 are electrically insulated by dielectric materials, usually referred to as intermetal dielectrics (IMD). In some embodiments, the signal tracks 310 and vias 550 may be formed of conductive materials, such as titanium, titanium nitride, tantalum, tantalum nitride, copper, silver, aluminum, gold, tungsten, combinations thereof, or the like. For example, in some embodiments, titanium is used as an adhesive layer and titanium nitride is used as a filling layer over the titanium layer. In some embodiments, the IMD comprises silicon oxide, silicon nitride, silicon oxynitride, silicon carbide, un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), or the like.

Although FIG. 3 shows only one layer of signal tracks, the semiconductor device 100" may include more than one layer of signal tracks. The semiconductor device 100" may include 5 to 20 layers of signal tracks.

Figure 4:
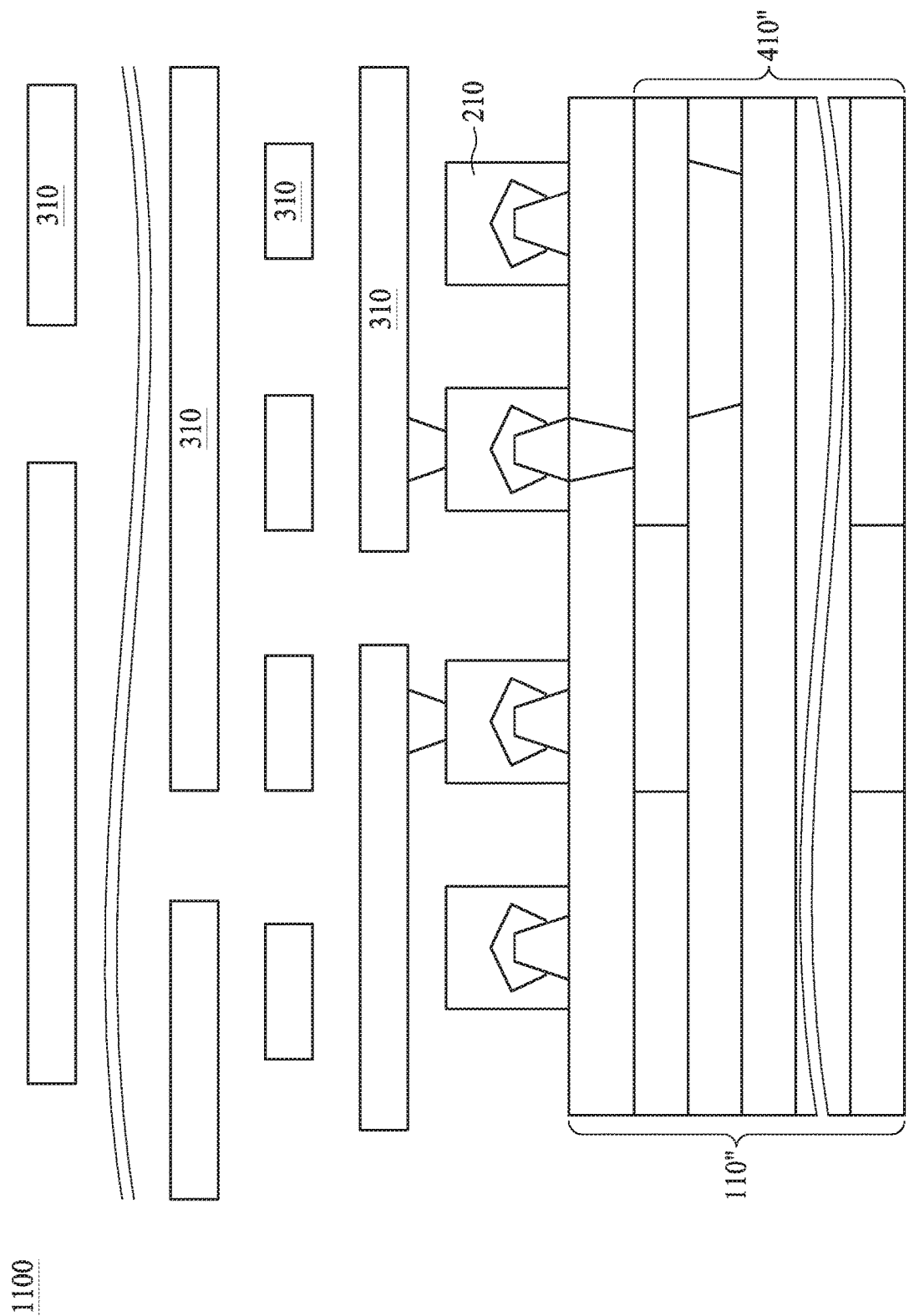
FIG. 4 is a cross-section view of a semiconductor device, in accordance with some embodiments of the present disclosure.

FIG. 4 illustrates a cross-section view of a semiconductor device 1100 of the present disclosure. The semiconductor device 1100 includes a base 110", source/drain electrodes 210, gate electrodes, signal tracks 310 and a power mesh 410". The semiconductor device 1100 includes multiple signal tracks 310. The semiconductor device 1100 may include 3 to 30 layers of signal tracks 310. In some embodiments, the semiconductor device 1100 may include 5 to 20 layers of signal tracks 310. The power mesh 410" includes multiple power rails. The power mesh 410" may include 3 to 30 layers of power rails. In some embodiments, the power mesh 410" may include 5 to 20 layers of power rails.

According to one aspect of the present disclosure, a semiconductor device includes a base having a first surface, source and drain electrodes and gate electrodes arranged on the first surface of the base, wherein the gate electrodes are extended along a first direction; signal tracks arranged above the first surface of the base and above the source and drain electrodes and the gate electrodes, wherein the signal tracks are extended along the first directions; and a power mesh arranged below the first surface of the base, the power mesh including first power rails extended in the second direction and second power rails extended in a first direction, wherein the second direction is substantially perpendicular to the first direction. In one or more of the foregoing and following embodiments, the semiconductor device includes at least one via through the base for coupling the source and drain electrodes to the power mesh in a third direction, the third direction is substantially perpendicular to the first surface of the base. In one or more of the foregoing and following embodiments, the semiconductor device includes a second via through the base for coupling the first power rails to the second power rails in the third direction. In one or more of the foregoing and following embodiments, the semiconductor device includes at least one via for coupling the source and drain electrodes to the signal tracks in the third direction. In one or more of the foregoing and following embodiments, the source and drain electrodes are arranged in an array. In one or more of the foregoing and following embodiments, each of the source and drain electrodes in a row in the second direction has a first edge and a second edge opposite the second edge, wherein each first edge of the source and drain electrodes are aligned with each other, and each second edge of the source and drain electrodes are aligned with each other. In one or more of the foregoing and following embodiments, at least two of the vias coupling the source and drain electrodes to the signal tracks are arranged in rows along the second direction. In one or more of the foregoing and following embodiments, the semiconductor device includes vias for coupling the gate electrodes to the signal tracks. In one or more of the foregoing and following embodiments, the vias for coupling the gate electrodes to the signal tracks are arranged on gate electrodes in row along the second direction. In one or more of the foregoing and following embodiments, the first power rails are arranged closer to the first surface of the base than the second power rails. In one or more of the foregoing and following embodiments, the power mesh includes third power rails further away from the first surface of the base than the second power rails, wherein the third power rails are extended in the second direction. In one or more of the foregoing and following embodiments, each of the signal tracks couples two gate electrodes adjacent and aligned in the first direction with two fourth vias aligned in the first direction. In one or more of the foregoing and following embodiments, the fourth vias corresponding to adjacent signal tracks are arranged in rows along the second direction. In one or more of the foregoing and following embodiments, the base includes more than one substrate, wherein the source and drain electrodes are arranged on a first surface of a first substrate, and wherein the first power rails are arranged on a second surface of the first substrate opposite the first surface of the first substrate. In one or more of the foregoing and following embodiments, the base is a single substrate, wherein the second power rails are arranged on the second surface of the base. In one or more of the foregoing and following embodiments, the power mesh is embedded in the base. In one or more of the foregoing and following embodiments, the power mesh includes more than three layers power rails, and the power rails electrically connect to the signal tracks with the vias through the base.

In accordance with another aspect of the present disclosure, a semiconductor device includes a base having a first surface, source and drain electrodes and gate electrodes arranged on the first surface of the base, wherein each of the source and drain electrodes has a first edge and a second edge opposite the second edge, wherein each first edge of the source and drain electrodes are aligned with each other, and wherein each second edge of the source and drain electrodes are aligned with each other; signal tracks arranged above the first surface of the base and above the source and drain electrodes and the gate electrodes; and a power mesh including first power rails extended in a second direction and second power rails extended in a first direction, wherein the second direction is perpendicular to the first direction, wherein the power mesh is arranged below base having a first surface. In one or more of the foregoing and following embodiments, the semiconductor device further includes third vias for coupling the source and drain electrodes to the signal tracks, wherein at least two of the vias are arranged in row along the second direction. In one or more of the foregoing and following embodiments, the semiconductor device further includes fourth vias for coupling the gate electrodes to the signal tracks, wherein the fourth vias are arranged on gate electrodes in row in the second direction.

In accordance with another aspect of the present disclosure, a semiconductor device includes a base, source and drain electrodes and gate electrodes on the base, wherein the gate electrodes are extended along a first direction; signal tracks extended along the first directions; and a power mesh comprising first power rails extended in the second direction and second power rails extended in a first direction, wherein the second direction is substantially perpendicular to the first direction, wherein the signal tracks and the power mesh are arrange at different height levels. In one or more of the foregoing and following embodiments, the base has a first surface, the source and drain electrodes and gate electrodes arranged on the first surface of the base, and the power mesh is arranged below the first surface of the base.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a base having a first surface;
   source and drain electrodes and gate electrodes arranged on the first surface of the base, wherein the gate electrodes are extended along a first direction;
   signal tracks arranged above the first surface of the base and above the source and drain electrodes and the gate electrodes, wherein the signal tracks are extended along the first direction;
   a power mesh arranged below the first surface of the base, the power mesh comprising first power rails extended in a second direction and second power rails extended in the first direction, wherein the second direction is substantially perpendicular to the first direction; and
   first vias through the base for coupling the first power rails to the second power rails in a third direction substantially perpendicular to the first surface of the base,
   wherein the first vias are aligned with crossings of the first power rails and the second power rails in the third direction.

2. The semiconductor device of claim 1, further comprising second vias through the base for coupling the source and drain electrodes to the power mesh in the third direction.

3. The semiconductor device of claim 1, further comprising second vias for coupling the source and drain electrodes to the signal tracks in the third direction.

4. The semiconductor device of claim 3, wherein at least two of the second vias are arranged in rows along the second direction.

5. The semiconductor device of claim 1,
   wherein the source and drain electrodes are arranged in an array, and
   wherein each of the source and drain electrodes in a row in the second direction has a first edge and a second edge opposite the second edge, wherein each first edge of the source and drain electrodes are aligned with each other, and wherein each second edge of the source and drain electrodes are aligned with each other.

6. The semiconductor device of claim 1, further comprising second vias for coupling the gate electrodes to the signal tracks.

7. The semiconductor device of claim 6, wherein the second vias are arranged on gate electrodes in row along the second direction.

8. The semiconductor device of claim 1, wherein the first power rails are arranged closer to the first surface of the base than the second power rails.

9. The semiconductor device of claim 1, wherein the power mesh further comprising third power rails further away from the first surface of the base than the second power rails, and wherein the third power rails are extended in the second direction.

10. The semiconductor device of claim 1, wherein each of the signal tracks couples two gate electrodes adjacent and aligned in the first direction with two second vias aligned in the first direction.

11. The semiconductor device of claim 10, wherein the second vias corresponding to adjacent signal tracks are arranged in rows along the second direction.

12. The semiconductor device of claim 1, wherein the base comprises more than one substrate, and wherein source and drain electrodes and gate electrodes arranged on a first surface of a first substrate, and wherein the first power rails are arranged on a second surface of the first substrate opposite the first surface of the first substrate.

13. The semiconductor device of claim 1, wherein the base is a single substrate, wherein the second power rails are arranged on the second surface of the base.

14. The semiconductor device of claim 1, wherein the power mesh is embedded in the base.

15. The semiconductor device of claim 1, wherein the power mesh comprises more than three layers power rails, and the power rails electrically connect to the signal tracks with second vias through the base.

16. The semiconductor device of claim 1, wherein the first power rails and the second power rails are substantially perpendicular to each other.

17. A semiconductor device, comprising:
   a base having a first surface;
   source and drain electrodes and gate electrodes arranged on the first surface of the base, wherein each of the source and drain electrodes has a first edge and a second edge opposite the second edge, wherein each first edge of the source and drain electrodes are aligned with each other, and wherein each second edge of the source and drain electrodes are aligned with each other;
   signal tracks arranged above the first surface of the base and above the source and drain electrodes and the gate electrodes;
   a power mesh comprising first power rails extended in a second direction and second power rails extended in a first direction, wherein the second direction is perpendicular to the first direction, wherein the power mesh is arranged below base having a first surface; and
   first vias through the base for coupling the first power rails to the second power rails in a third direction substantially perpendicular to the first surface of the base,
   wherein the first vias are aligned with crossings of the first power rails and the second power rails in the third direction.

18. The semiconductor device of claim 17, further comprising second vias for coupling the source and drain electrodes to the signal tracks, wherein at least two of the vias are arranged in row along the second direction.

19. The semiconductor device of claim 17, further comprising second vias for coupling the gate electrodes to the signal tracks, wherein the vias are arranged on gate electrodes in row in the second direction.

20. A semiconductor device, comprising:
a base,
source and drain electrodes and gate electrodes on the base, wherein the gate electrodes are extended along a first direction;
signal tracks extended along the first direction;
a power mesh comprising first power rails extended in the second direction and second power rails extended in the first direction, wherein the second direction is substantially perpendicular to the first direction; and
first vias through the base for coupling the first power rails to the second power rails in a third direction substantially perpendicular to a first surface of the base,
wherein the first vias are aligned with crossings of the first power rails and the second power rails in the third direction, and
wherein the signal tracks and the power mesh are arranged at different height levels.

\* \* \* \* \*